(12) United States Patent
van den Heuvel et al.

(10) Patent No.: US 11,342,923 B1
(45) Date of Patent: May 24, 2022

(54) CIRCUIT AND METHOD FOR RANDOM EDGE INJECTION LOCKING

(71) Applicant: Stichting IMEC Nederland, Eindhoven (NL)

(72) Inventors: Johan van den Heuvel, Geldrop (NL); Paul Mateman, Millingen (NL); Yuming He, Eindhoven (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 17/401,924

(22) Filed: Aug. 13, 2021

(30) Foreign Application Priority Data

Nov. 5, 2020 (EP) .................................. 20205829

(51) Int. Cl.
*H03L 7/081* (2006.01)
*H03L 7/099* (2006.01)

(52) U.S. Cl.
CPC .......... *H03L 7/0814* (2013.01); *H03L 7/0995* (2013.01)

(58) Field of Classification Search
CPC ........................... H03L 7/0814; H03L 7/0995
USPC .................. 327/147–149, 156–158
See application file for complete search history.

(56) References Cited

U.S. PATENT DOCUMENTS

| | | | | |
|---|---|---|---|---|
| 5,451,911 A * | 9/1995 | Colvin | ............... | H03K 3/0315 331/25 |
| 7,545,232 B2 * | 6/2009 | Boos | ............... | H03C 3/0925 332/146 |
| 8,362,815 B2 * | 1/2013 | Pavlovic | ............... | H03L 7/081 327/158 |
| 8,634,512 B2 * | 1/2014 | Leung | ............... | H03C 3/0975 375/376 |
| 8,866,519 B1 * | 10/2014 | Hiebert | ............... | H03L 7/1976 327/147 |
| 9,300,307 B2 * | 3/2016 | Juneau | ............... | H03C 3/0925 |
| 9,306,585 B1 | 4/2016 | Elkholy et al. | | |
| 9,614,537 B1 | 4/2017 | Nandwana et al. | | |
| 9,819,356 B2 * | 11/2017 | Ponton | ............... | H03M 1/82 |
| 10,044,359 B1 * | 8/2018 | Kim | ............... | H03L 7/083 |
| 10,067,478 B1 * | 9/2018 | Kolar Ranganathan | ............... | H03K 5/159 |

(Continued)

FOREIGN PATENT DOCUMENTS

| | | |
|---|---|---|
| EP | 3249817 A1 | 11/2017 |
| KR | 20210144174 A * | 11/2021 |

OTHER PUBLICATIONS

Extended European Search Report and Written Opinion, Application No. EP20205829.3, dated Apr. 23, 2021, 9 pages.

(Continued)

*Primary Examiner* — Adam D Houston
(74) *Attorney, Agent, or Firm* — McDonnell Boehnen Hulbert & Berghoff LLP

(57) ABSTRACT

A circuit for facilitating random edge injection locking of an oscillator comprises a clock signal and a digitally controlled delay line, where the digitally controlled delay line is configured to delay the clock signal, thereby generating a delayed clock signal. The circuit further comprises an edge selector configured to generate a phase select signal with a random pulse sequence. Moreover, the circuit comprises a pulse generator downstream to the digitally controlled delay line configured to generate injection pulses from the delayed clock signal for at least two phases of the oscillator based on the phase select signal.

14 Claims, 11 Drawing Sheets

(56) References Cited

U.S. PATENT DOCUMENTS

| | | | |
|---|---|---|---|
| 10,110,239 B1 | 10/2018 | Shu et al. | |
| 10,567,154 B1* | 2/2020 | Wentzloff | H03L 7/0995 |
| 10,659,060 B2* | 5/2020 | Monk | H03L 7/085 |
| 10,790,833 B1* | 9/2020 | Zanchi | H03L 7/0993 |
| 10,819,353 B1* | 10/2020 | Monk | H03L 7/23 |
| 10,895,850 B1* | 1/2021 | Elkholy | H03M 3/368 |
| 11,201,626 B1* | 12/2021 | Jung | H03L 7/0891 |
| 11,218,158 B1* | 1/2022 | Patil | H03M 1/1071 |
| 11,223,362 B2* | 1/2022 | Chiu | H03L 7/08 |
| 11,231,741 B1* | 1/2022 | Buchwald | H03L 7/07 |
| 2009/0167384 A1* | 7/2009 | Sohn | H03L 7/183 |
| | | | 327/156 |
| 2009/0262877 A1* | 10/2009 | Shi | H03L 1/022 |
| | | | 712/241 |
| 2010/0109714 A1* | 5/2010 | Lindfors | G06F 1/022 |
| | | | 327/105 |
| 2013/0058437 A1* | 3/2013 | Oshima | H03M 1/0836 |
| | | | 341/166 |
| 2013/0222026 A1* | 8/2013 | Havens | H03L 7/103 |
| | | | 327/158 |
| 2014/0320182 A1* | 10/2014 | Sanderford, Jr | H04W 36/08 |
| | | | 327/156 |
| 2014/0354336 A1* | 12/2014 | Syllaios | H03L 7/193 |
| | | | 327/156 |
| 2016/0373120 A1* | 12/2016 | Caffee | H03L 7/183 |
| 2018/0097521 A1* | 4/2018 | Hammerschmidt | H03L 7/104 |
| 2018/0269885 A1* | 9/2018 | Kondo | H03L 7/091 |
| 2019/0007055 A1* | 1/2019 | Nelson | H03K 5/133 |
| 2019/0058480 A1* | 2/2019 | Kuan | H03L 7/089 |
| 2019/0115926 A1* | 4/2019 | Ximenes | H03L 7/085 |
| 2020/0212916 A1* | 7/2020 | Moe | H03K 5/14 |
| 2020/0212943 A1* | 7/2020 | Banin | H04B 1/04 |
| 2020/0219335 A1* | 7/2020 | Gintz | G06F 9/4411 |
| 2020/0249715 A1* | 8/2020 | Seger, Jr | H04B 1/0007 |
| 2021/0067182 A1* | 3/2021 | Ravi | H04B 1/0483 |
| 2022/0029650 A1* | 1/2022 | Banin | H04B 7/10 |

OTHER PUBLICATIONS

Deng, Wei, Dongsheng Yang, Aravind Tharayil Narayanan, Kengo Nakata, Teerachot Siriburanon, Kenichi Okada, and Akira Matsuzawa. "14.1 a 0.048 mm 2 3mW synthesizable fractional-N PLL with a soft injection-locking technique." In 2015 IEEE International Solid-State Circuits Conference—(ISSCC) Digest of Technical Papers, pp. 1-3. IEEE, 2015.

Yan, Chenggang, Jianhui Wu, Jie Sun, Jin Jin, and Chen Hu. "A Low Phase Noise Open Loop Fractional-N Frequency Synthesizer With Injection Locking Digital Phase Modulator." IEEE Transactions on Circuits and Systems II: Express Briefs 67, No. 3 (2019): 455-459.

Kobayashi, Mayu, Yuya Masui, Takao Kihara, and Tsutomu Yoshimura. "Spur reduction by self-injection loop in a fractional-N PLL." In 2017 24th IEEE International Conference on Electronics, Circuits and Systems (ICECS), pp. 260-263. IEEE, 2017.

He, Yuming, Yao-Hong Liu, Takashi Kuramochi, Johan van den Heuvel, Benjamin Busze, Nereo Markulic, Christian Bachmann, and Kathleen Philips "24.7 A 673µW 1.8-to-2.5 GHz dividerless fractional-N digital PLL with an inherent frequency-capture capability and a phase-dithering spur mitigation for IoT applications." In 2017 IEEE International Solid-State Circuits Conference (ISSCC), pp. 420-421. IEEE, 2017.

* cited by examiner

CIRCUIT AND METHOD FOR RANDOM EDGE INJECTION LOCKING

CROSS-REFERENCE TO RELATED APPLICATIONS

The present application is a non-provisional patent application claiming priority to European Patent Application No. 20205829.3, filed Nov. 5, 2020, the contents of which are hereby incorporated by reference.

FIELD OF THE DISCLOSURE

This application relates to injection locking techniques for injection-locked digital phase locked loop (IL-DPLLs), especially for DPLLs that support frequency modulation in Bluetooth Low Energy (BLE) technology.

BACKGROUND

The BLE technology is widely deployed in Internet-of-Things (IoT) applications due to its low energy consumption. Generally, BLE systems required a phase locked loop (PLL) that supports frequency modulation. To reduce the die area of a BLE transceiver, small area oscillators are implemented along with injection-locking techniques to suppress the phase noise performance of the oscillators. These systems often require the clock generator to support fractional-N mode. This feature allows the system to tune the frequency offset of the crystal oscillator and allows the clock generator to generate small steps in frequency without using a very small oscillator frequency.

For example, the document EP 3 249 817 A1 shows a DTC-based PLL operable at fractional-N mode with an improved PLL output spectral purity. However, during the fractional-N, the delay of the DTC changes periodically and the period depends on the fractional part of the frequency control word (FCW). Thus, the non-linearity of the DTC introduces periodic error, and this error leads to fractional spur at the output spectrum. In addition, the frequency offset of the oscillator and the timing error between the injection path and the PLL path generate periodic error lead to reference spur at the output spectrum.

SUMMARY

Example circuits, digital phase locked loops, and methods that can ameliorate one or more of the aforementioned limitations are disclosed herein.

According to a first aspect, a circuit for facilitating random edge injection locking of an oscillator is provided. The circuit comprises a clock signal and a digitally controlled delay line, where the digitally controlled delay line is configured to delay the clock signal, thereby generating a delayed clock signal. The circuit further comprises an edge selector configured to generate a phase select signal with a random pulse sequence.

An example of the circuit comprises a pulse generator downstream from the digitally controlled delay line configured to generate injection pulses from the delayed clock signal for at least two phases of the oscillator based on the phase select signal. Therefore, the injection pulses are no longer injected to a fixed phase of the oscillator. Rather, the pulses are injected to different phases of the oscillator to break the repeating patterns that cause the spurs.

An example of the pulse generator is further configured to generate a first set of injection pulses for one phase of the at least two phases of the oscillator when the phase select signal is high and a second set of injection pulses for another phase of the at least two phases of the oscillator when the phase select signal is low.

For instance, the oscillator may generate RF signals at 90 degrees phase separation, i.e., at phases 0, 90, 180, and 270. In this regard, the pulse generator may generate a first set of pulses for the RF signals at phase 0 and a second set of pulses for the RF signals at phase 180, for example. Using the signal level of the phase select signal as a control input, the respective sets of pulses are injected to the respective phases of the oscillator. This facilitates the injection of pulses at different phases of the oscillator in a simplified and effective manner.

An example of the circuit further comprises control circuitry configured to tune a delay of the digitally controlled delay line based on a duty cycle of the clock signal to compensate at least one half of the oscillator period when injecting the injection pulses from one phase to the other phase of the at least two phases of the oscillator. This prevents the injection of pulses at an opposite or unwanted phase of the oscillator.

An example of the edge selector comprises a pseudo-random binary sequence generator and the phase select signal, in an example, comprises a pseudo-random binary sequence. Therefore, the random selection of phases of the oscillator to be injected is incorporated.

Examples of the oscillator include an inverter-based oscillator, an inverter-based ring oscillator, and a quadrature four-stage ring oscillator operable with a minimum phase separation equal to pi/2. The proposed random edge injection locking technique can be implemented in a cost-effective manner due to the smaller area of the oscillator.

An example of the oscillator is a multi-phase oscillator, and the pulse generator is configured to generate injection pulses for phases of the multi-phase oscillator based on the phase select signal. In this regard, the circuit further comprises switching circuitry downstream from the pulse generator to inject the injection pulses at the phases of the multi-phase oscillator, and the switching circuitry is configured to be operable via a random switching logic. The proposed solution can be implemented with oscillators operable with a minimum phase separation of pi/N, where N is an even integer.

According to a second aspect, a digital phase locked loop (DPLL) is provided. The DPLL comprises a reference clock signal, and a digital-to-time converter. The digital-to-time converter is configured to delay the reference clock signal, thereby generating a delayed reference clock signal. The DPLL further comprises an oscillator configured to generate radio frequency signals of at least two phases. Furthermore, the DPLL comprises a time to digital converter configured to generate an error signal by comparing an edge of the delayed reference clock signal and an edge of the radio frequency signals.

An example of the DPLL comprises a circuit configured to input the delayed reference clock signal and further to perform random edge injection locking of the oscillator according to the first aspect. An example of the DPLL further comprises a feedback path from the time-to-digital converter to a loop filter, and the loop filter is configured to tune the oscillator based on the error signal generated by the time-to-digital converter.

Therefore, the digital-to-time converter delays the reference signal where the delayed reference signal phase is compared to the phase of the RF signals of the oscillator to phase-lock the oscillator output. On the other hand, the circuit, especially the digitally controlled delay line, takes the delayed reference clock signal as clock signal input and further delays the delayed reference clock signal. In an example, the latter is used by the pulse generator along with the phase select signal to generate and further to inject pulses at different phases of the oscillator, thereby resetting the noisy phase in the oscillator.

An example of the DPLL further comprises injection control circuitry configured to control the generation of injection pulses at the pulse generator. In this regard, the injection control circuitry is further configured to enable or disable the generation of injection pulses at the pulse generator for a predefined number of cycles of the reference clock signal. This keeps the balance between the reference spur and the effectiveness of the proposed random edge injection locking scheme, especially by disabling the injection in different numbers of reference cycles.

Examples of the digital phase locked loop include an injection-locked fractional-N digital phase locked loop and an injection-locked ring-oscillator based fractional-N digital phase locked loop. The proposed DPLL supports BLE technology, especially the Gaussian-FSK modulation, and further provides a cost-effective solution due to the smaller size oscillator.

According to a third aspect, a method for facilitating random edge injection locking of an oscillator is provided. The method comprises the steps of providing a clock signal, generating a delayed clock signal, generating a phase select signal with a random pulse sequence, and generating injection pulses from the delayed clock signal for at least two phases of the oscillator based on the phase select signal. Therefore, the injection pulses are injected to different phases of the oscillator to break the repeating patterns, thereby suppressing the level of reference spur and fractional spur effectively.

An example of the method further comprises the step of generating a first set of injection pulses for one phase of the at least two phases of the oscillator when the phase select signal is high. In addition, the method further comprises the step of generating a second set of injection pulses for another phase of the at least two phases of the oscillator when the phase select signal is low. This facilitates the injection of the injection pulses at different phases of the oscillator in a simplified and effective manner.

An example of the method further comprises the step of compensating at least one half of an oscillator period when injecting the injection pulses from one phase to the other phase of the at least two phases of the oscillator. This prevents the injection of pulses at an opposite or unwanted phase of the oscillator.

BRIEF DESCRIPTION OF THE FIGURES

The above, as well as additional features, will be better understood through the following illustrative and non-limiting detailed description of example embodiments, with reference to the appended drawings.

All the figures are schematic, not necessarily to scale, and generally only show parts that are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
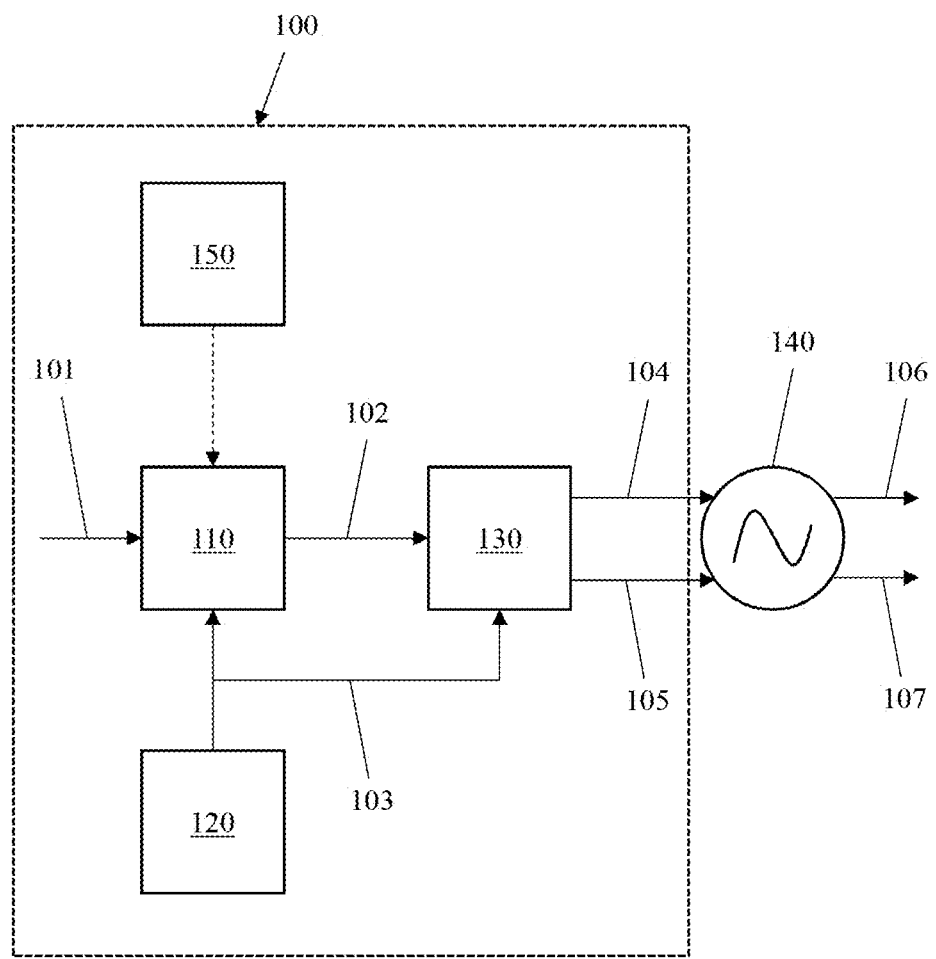
FIG. 1 shows a first circuit, according to an example of the first aspect.

FIG. 1 illustrates a first example embodiment of the circuit 100 according to the first aspect. The circuit 100 comprises a clock signal 101 that is fed to a digitally controlled delay line or DCDL 110, where the DCDL 110 generates a delayed clock signal 102 by delaying the clock signal 101. The circuit 100 further comprises an edge selector 120 that generates a phase select signal 103 with a random pulse sequence. An example of the edge selector 120 comprises a pseudo-random binary sequence generator that generates a pseudo-random binary sequence, i.e., PRBS-k as the phase select signal 103, where k defines the size of a unique word of data in the sequence. However, other random sequences, e.g., true random sequences, chaotic sequences, and the like, as known in the art can also be implemented to generate the phase select signal 103.

The circuit 100 further comprises a pulse generator 130 downstream from the DCDL 110 and an oscillator 140 downstream from the pulse generator 130. The oscillator 140 is configured to generate radio frequency (RF) signals 106,107 of at least two phases, and in some examples, more. In this regard, the pulse generator 130 generates injection pulses 104,105 from the delayed clock signal 102 for the two phases of the oscillator 140 based on the phase select signal 103. The generation of the phase select signal 103 and the injection arrangement for the oscillator 140 will be discussed in the later sections in detail.

Therefore, the circuit 100 effectively ameliorates the two main limitations specifically associated with a fractional-N injection-locked oscillator, namely the high reference spur and the high fractional spur at the output spectrum. The circuit 100 effectively breaks the repeating patterns of pulse injection, especially by injecting pulses at different phases of the oscillator 140.

For instance, if the above-mentioned injection locking is to be performed for a PLL with fractional-N mode having an injection-locked oscillator, the clock signal may correspond to the reference clock signal and the DCDL 110 can be extended to have a first DCDL and a second DCDL. The first DCDL (i.e., a digital to time converter) may generate a first delayed reference clock signal by delaying the reference clock signal and the second DCDL may generate a second delayed reference clock signal by delaying the first reference clock signal. Then, the pulse generator 130 may generate the injection pulses 104,105 from the second delayed reference clock signal for the two phases of the oscillator 140 based on the phase select signal 103. Therefore, the oscillator 140 will be locked with respect to the first delayed reference clock signal, whereas the second delayed reference clock signal is used to generate the injection pulses 104,105.

It is important that when the pulses are sent from one phase to another phase of the oscillator 140, one-half of the oscillator period needs to be compensated by the DCDL 110. Otherwise, a large error will be introduced, which, in itself, may cause large spurious emissions at the output spectrum. To do so, the circuit 100 comprises control circuitry 150 that is configured to tune the delay of the DCDL 110 based on the duty cycle of the clock signal 101 or the reference clock signal coming from, for instance, a crystal oscillator. In this regard, the control circuitry 150 is configured to tune the DCDL 110 according to the digital RF duty-cycle of the oscillator 140 and further to perform static timing offset calibration of the DCDL 110 by taking into account the random pulse sequence from the edge selector 120, for instance.

Figure 2:
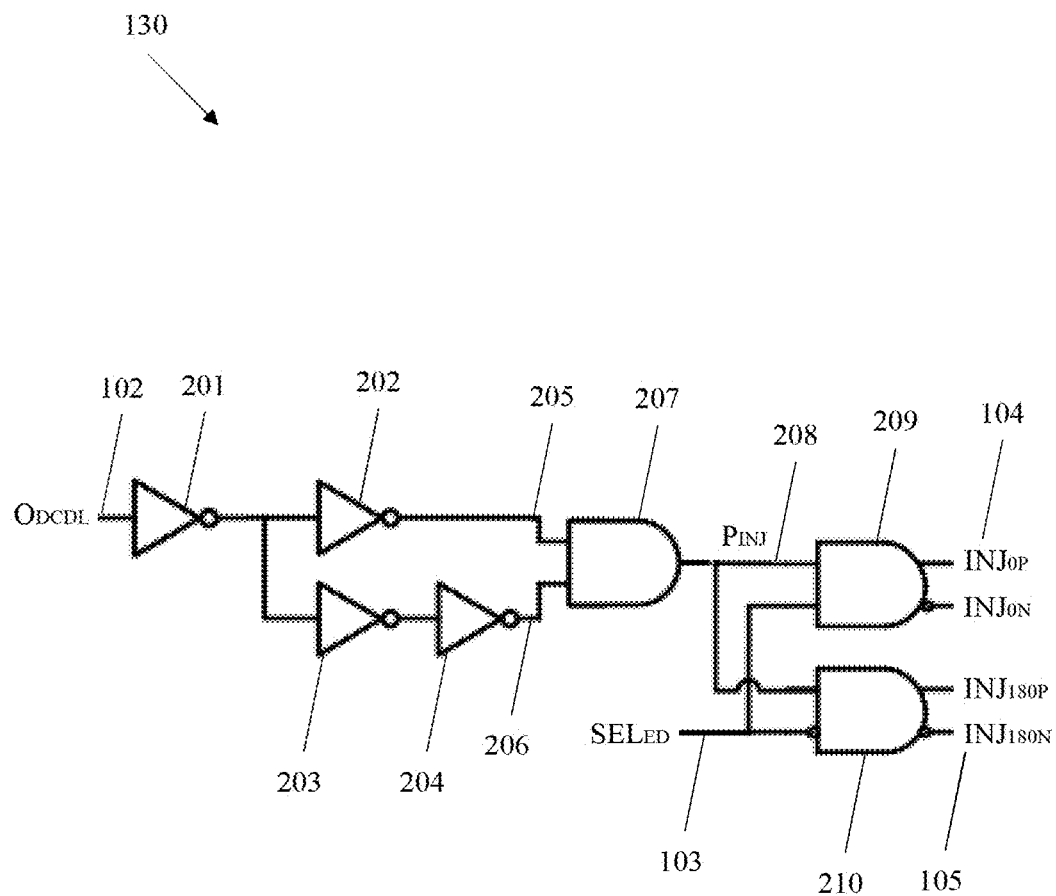
FIG. 2 shows a pulse generator, according to an example of the first aspect.

FIG. 2 illustrates an example embodiment of the pulse generator 130 according to the first aspect. Here, the implementation of the pulse generator 130 is illustrated with digital logic gates, namely NOT gates or inverters and AND gates. However, it is to be noted that any alternative logic gate arrangements are feasible so long as the output results in short pulses from a continuous signal. During the operation, the delayed clock signal 102 is inputted at a first inverter 201 that inverts the polarity of the delayed clock signal 102. The output of the first inverter 201 acts as a common node, which serves two propagation paths 205,206. The output of the first inverter 201 passes through a second inverter 202 along the propagation path 205, reverting the polarity again that results in the delayed clock signal 102, along with the propagation delay caused by the first and second inverter 201,202, respectively.

Along the propagation path 206, the output of the first inverter 201 is inverted twice, by a third inverter 203 and a fourth inverter 204, respectively. This results in the delayed clock signal 102 with an opposite polarity along with propagation delay caused by the first inverter 201, the third inverter 203 and the fourth inverter 204. The signals at the propagation paths 205,206 are fed to a first AND gate 207. Due to the inversion stages, the signal at the propagation path 205 has an opposite polarity to the signal at the propagation path 206. However, with the additional delay caused by the fourth inverter 204, the signals will have the same polarity for a brief moment, especially defined by the delay time caused by each delay stage of the inverters 201,202,203,204,205. For this brief moment, the AND gate output will be high and will produce a pulse or injection pulse 208 with a width corresponding to the delay time of each inverter delay stage.

The injection pulse 208 is then fed to a second AND gate 209, where the second input of the AND gate 209 is the phase select signal 103. Therefore, the output 104 of the second AND gate 209 will be high when the phase select signal 103 is high. Additionally, the injection pulse 208 is fed to a third AND gate 210 where the second input of the AND gate 210 is also the phase select signal, however with an opposite polarity, i.e., inverted via an inverter in-between. Therefore, the output 105 of the third AND gate will be high when the phase select signal 103 is low. To facilitate complementary arrangements, e.g., a CMOS implementation, the outputs 104, 105 of the second AND gate 209 and the third AND gate 210, respectively, are further inverted. In FIG. 2, the outputs 104 of the second AND gate 209 are shown as $INJ_{OP}$ and $INJ_{ON}$ for P-type and N-type transistors, respectively, in a CMOS configuration. Similarly, the outputs 105 of the third AND gate 210 are shown as $INJ_{180P}$ and $INJ_{180N}$ for P-type and N-type transistors, respectively, in a CMOS configuration.

Figure 3:
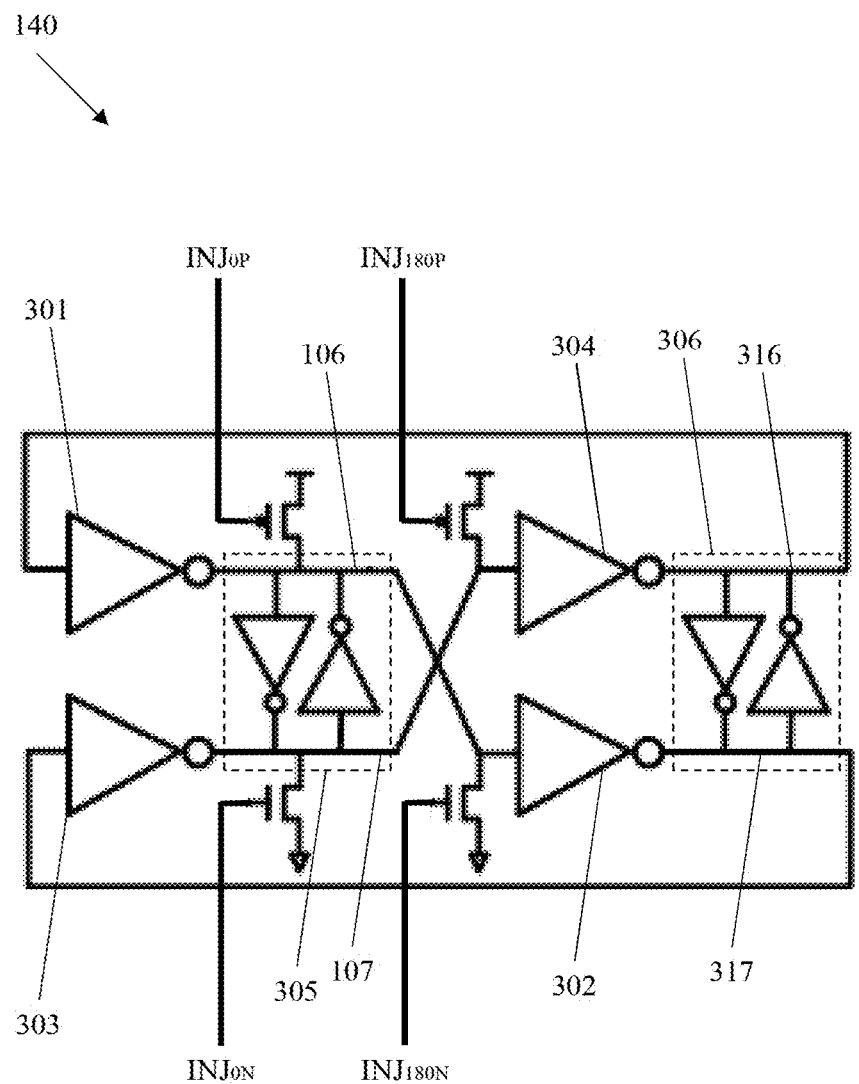
FIG. 3 shows an oscillator, according to an example of the first aspect.

FIG. 3 illustrates an example embodiment of the oscillator 140 according to the first aspect. Particularly, FIG. 3 shows the injection scheme for injecting the injection pulses at different phases of the oscillator 140. The oscillator 140 illustrated herein is a quadrature four-stage ring oscillator having a 90° of phase separation. The four stages correspond to four inverters, namely a first inverter 301, a second inverter 302, a third inverter 303, and a fourth inverter 304. The first inverter 301 corresponds to a first stage output 106, the second inverter 302 corresponds to a second stage output 317, the third inverter 303 corresponds to a third stage output 107, and the fourth inverter 304 corresponds to a fourth stage output 316.

The first stage output 106 and the third stage output 107 carry complementary waveforms and so do the second stage output 317 and the fourth stage output 316. In addition, the latter two are 90 degrees out of phase with respect to the former two. Hence, the oscillator 140 consists of four one-pole stages, thereby generating 90 degrees of phase separations between consecutive nodes when oscillating. However, the outputs 106,317,107,316 prefer to latch up and then the loop can indefinitely maintain the first stage output 106 and the third stage output 107 high, and the second stage output 317 and the fourth stage output 316 low, or vice versa.

To prevent the indefinite latch up, a first pair of cross-coupled inverters 305 is included between the first stage output 106 and the third stage output 107 and further a second pair of cross-coupled inverters 306 is included between the second stage output 317 and the fourth stage output 316. The first pair of cross-coupled inverters 305 and the second pair of cross-coupled inverters 306 prevent equal logical states at their respective input and output nodes.

The injection pulses $INJ_{OP}$, $INJ_{ON}$ and $INJ_{180P}$, $INJ_{180N}$, as shown in FIG. 2, are injected in a complementary arrangement at the respective phases of the oscillator 140. In particular, the injection pulse $INJ_{OP}$ is injected at the first stage output 106, whereas the injection pulse $INJ_{ON}$ is injected at the third stage output 107, which carries a complementary waveform to the first stage output 106. Similarly, the injection pulse $INJ_{180P}$ is injected at the third stage output 107, whereas the injection pulse $INJ_{180N}$ is injected at the first stage output 106, which carries a complementary waveform to the second stage output 107.

In other words, the RF signals from the first stage output 106 correspond to RF signals at phase 0 of the oscillator 140 and the RF signals from the third stage output 107 correspond to RF signals at phase 180 of the oscillator 140. It is to be noted that the injection principle can be analogously implemented for the second stage output 317 and the fourth stage output 316, thereby injection locking the oscillator 140 at phases 90 and 270, respectively.

Figure 4:
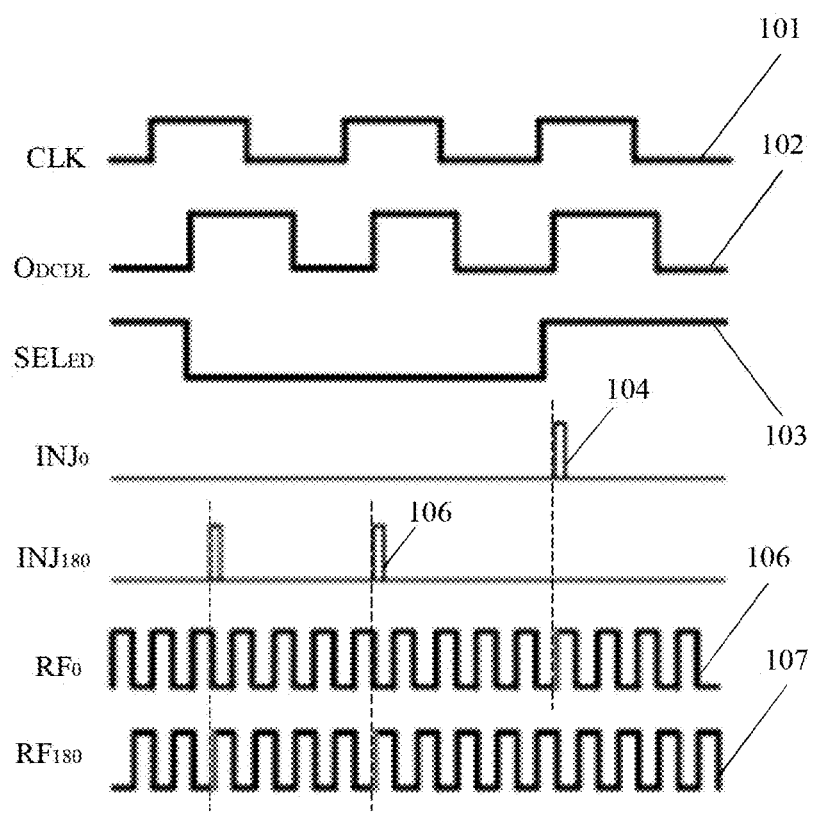
FIG. 4 shows a timing diagram of operations, according to an example of the first aspect.

FIG. 4 illustrates an example timing diagram of operations according to the first aspect. The signal CLK represents the clock signal 101 of the DCDL 110 and the signal $O_{DCDL}$ represents the delayed clock signal 102. The signal $SEL_{ED}$ represents the phase select signal 103 with random sequences for the polarity of the signal. The signals $INJ_0$ and $INJ_{180}$ represent the injection pulses 104 and 106, respectively, generated by the pulse generator 130. It can be seen that the injection pulses $INJ_0$ are generated when $SEL_{ED}$ is high and the injection pulses $INJ_{180}$ are generated when $SEL_{ED}$ is low.

The signal $RF_0$ represents the RF signals at phase 0 of the oscillator 140 and the signal $RF_{180}$ represents the RF signals at phase 180 of the oscillator 140. It can be seen that when $SEL_{ED}$ is high, the injection pulses $INJ_0$ are injected at phase 0 of the oscillator 140 as a clean reference pulse to reset $RF_0$. Further, when $SEL_{ED}$ is low, the injection pulses $INJ_{180}$ are injected at phase 180 of the oscillator 140 as a clean reference pulse to reset $RF_{180}$.

Figure 5:
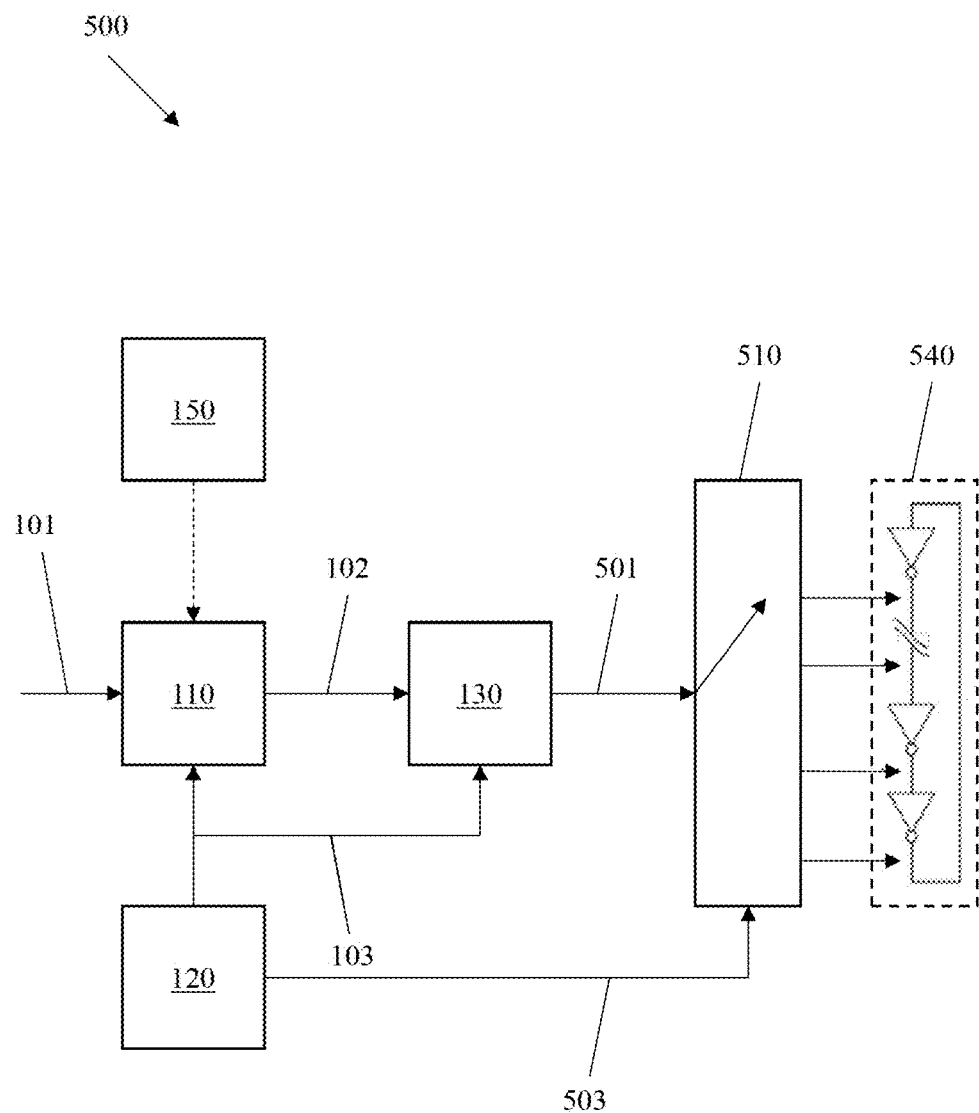
FIG. 5 shows a circuit, according to an example of the first aspect.

FIG. 5 illustrates a second example embodiment of the circuit 500 according to the first aspect. The circuit 500 differs from the circuit 100 of FIG. 1 in that the circuit 500 comprises a multi-phase oscillator 540 and additional switching circuitry 510 to drive the injection pulses 501 to a respective phase of the oscillator 540. The multi-phase oscillator 540 can be a multi-stage ring oscillator, a multi-stage LC oscillator, or any oscillator operable with a minimum phase separation of pi/N, where N is an integer greater than 1, and in an example, an even integer.

The switching circuitry 510 is configured to be operable via a random switching logic 503, which in an example, is generated by the edge selector 120. In this regard, the edge selector may further tune the DCDL 110 based on the random switching logic 503, for instance, via normalization, to synchronize the injection pulses 501 with the respective phases of the multi-phase oscillator 540.

Figure 6:
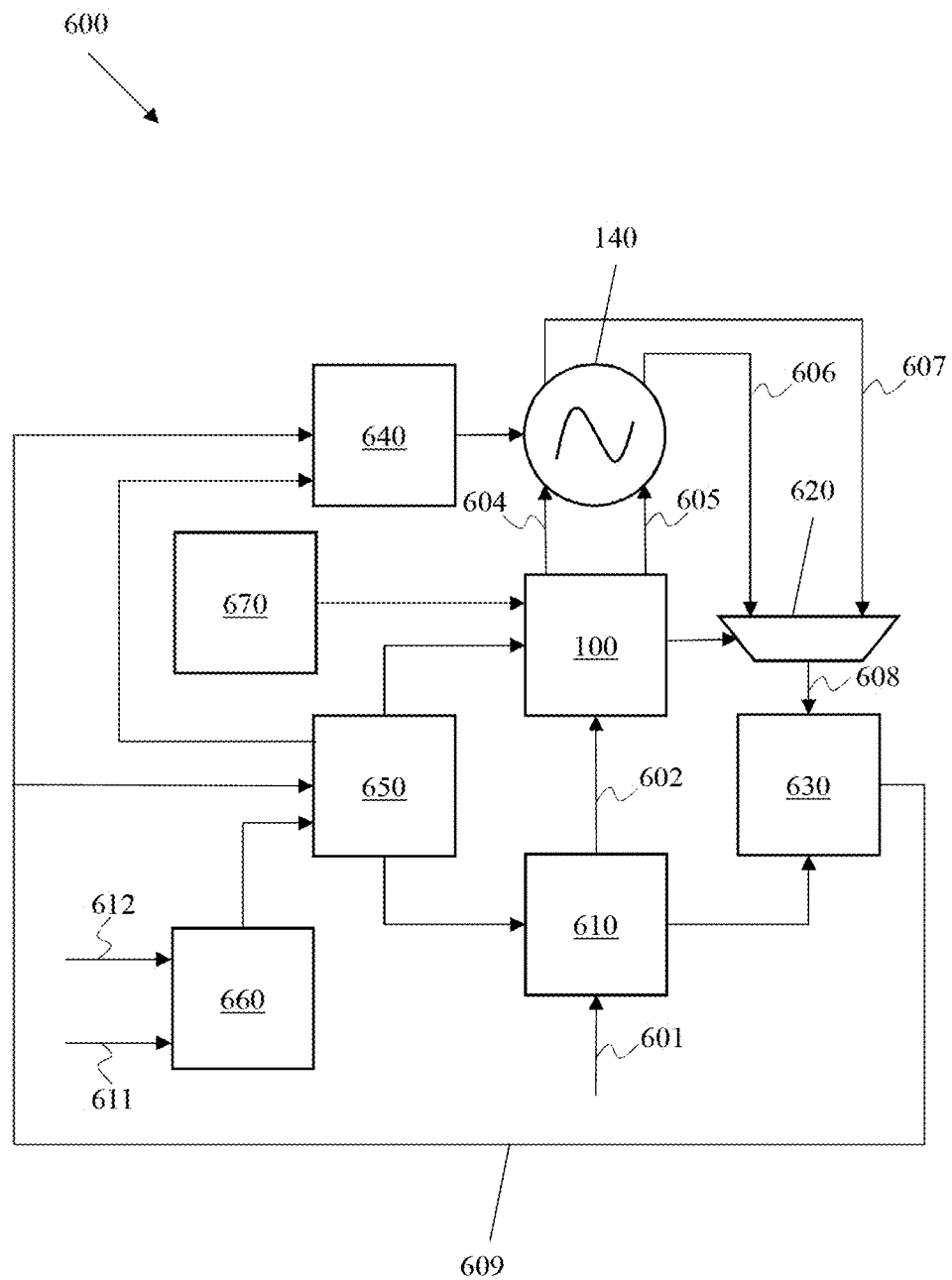
FIG. 6 shows a digital phase locked loop, according to an example of the second aspect.

FIG. 6 illustrates an example embodiment of the digital phase locked loop (DPLL) 600 according to the second aspect. The DPLL 600 comprises a reference clock signal 601, which in an example, is generated from an on-board crystal oscillator (not shown), and a digital-to-time converter (DTC) 610. The DTC 610 generates a delayed reference clock signal 602 by delaying the reference clock signal 601. The DPLL 600 further comprises the circuit 100 according to the first aspect, downstream from the DTC 610 so that the circuit 100 can take the delayed reference clock signal 602 as its input clock signal. The DPLL 600 further comprises the oscillator 140 that generates RF signals at phases 0 and 180, for example, as described above with respect to FIG. 3.

As described above with respect to FIG. 1, the circuit 100 generates injection pulses 604,605 from the delayed reference clock signal 602 for the two phases of the oscillator 140. The oscillator 140 outputs RF signals at two phases 606,607 that are reset by the injection pulses 604,605 and are further fed to a multiplexer 620. The multiplexer 620 is implemented as, for instance, a 2×1 multiplexer, which takes the RF signals as inputs and outputs a selective RF signal 608 out of the two based on a control signal. The control signal is, in an example, the phase select signal 103 provided by the edge selector 120. Hence, when the phase select signal 103 is high, the multiplexer 620 will output the RF signal at phase 0 of the oscillator 140 and when the phase select signal 103 is low, the multiplexer 620 will output the RF signal at phase 180 of the oscillator.

The DPLL 600 further comprises a time-to-digital converter (TDC) 630 that compares an edge of the delayed reference clock signal 602 at the output of DTC 610 with an edge of the RF signals 606,607 at the output 608 of the multiplexer 620. Therefore, the TDC 630 generates an error signal based on the difference between the edges, i.e., phase difference, of the signals. The error signal is fed to a loop filter 640 through a feedback path 609, where the loop filter 640 tunes the oscillator 140 based on the error signal.

It is to be noted that, if the proposed injection locking technique, as performed by the circuit 100, is not implemented in the DPLL 600, the DPLL 600 would align the phases between the output 602 of the DTC 610 and the output 608 of the multiplexer 620 with a random pattern. In other words, the DTC output 602 sometimes may align with the oscillator phase $RF_0$ and sometimes may align with $RF_{180}$ in a random manner. Hence, the injection pulses may sometimes be sent to the opposite RF edge if the DTC output 602 is directly used to generate the injection pulses without any compensation for the random patterns. This may result in huge disturbances to the oscillator 140 and may cause large spurious emissions.

The proposed random edge injection technique, as facilitated by the circuit 100, allows the DPLL 600 to align the DTC output 602, for instance, with rising edges of $RF_{180}$ when the phase select signal 103 is high, and, for instance, with rising edges of $RF_0$ when the phase select signal 103 is low. The proposed random edge injection technique further ensures the polarity of the injection signals as described above with respect to FIG. 2 and FIG. 3, so that the injection pulses $INJ_{0P}$ and $INJ_{0N}$ are generated if the phase select signal 103 is high. Otherwise, the injection pulses $INJ_{180P}$ and $INJ_{180N}$ are generated.

The DPLL 600 further comprises an accumulator 660 that comprises a control input 611 and a data input 612. The control input 611 corresponds to frequency control input, e.g., a frequency control word (FCW), and the data input 612 corresponds to the transmission data, especially during modulation. The accumulator 660 generally comprises a counter or counters for counting, e.g., the edges of the oscillator 140 in one reference clock to coarsely tune the oscillator 140 to the target frequency. In some examples, the accumulator 660 is disabled during the fine-tuning of the oscillator 140, i.e., the correction of the phase error between the RF edge 608 and the delayed reference edge 602.

The DPLL 600 further comprises so-called estimators 650, which estimate and further calibrate, for instance, the duty cycle of the reference clock signal 601 (crystal oscillator duty cycle), the duty cycle of the oscillator 140, static timing offset for the DCDL, and so on. The DPLL 600 further comprises injection control circuitry 670 that is configured to control the generation of the injection pulses 604,605 at the pulse generator 130. In particular, the injection control circuitry enables or disables the injection path for a selective number of cycles or periods of the reference clock signal 601. The operation of the injection control circuitry will be described in a later section in detail.

Figure 7:
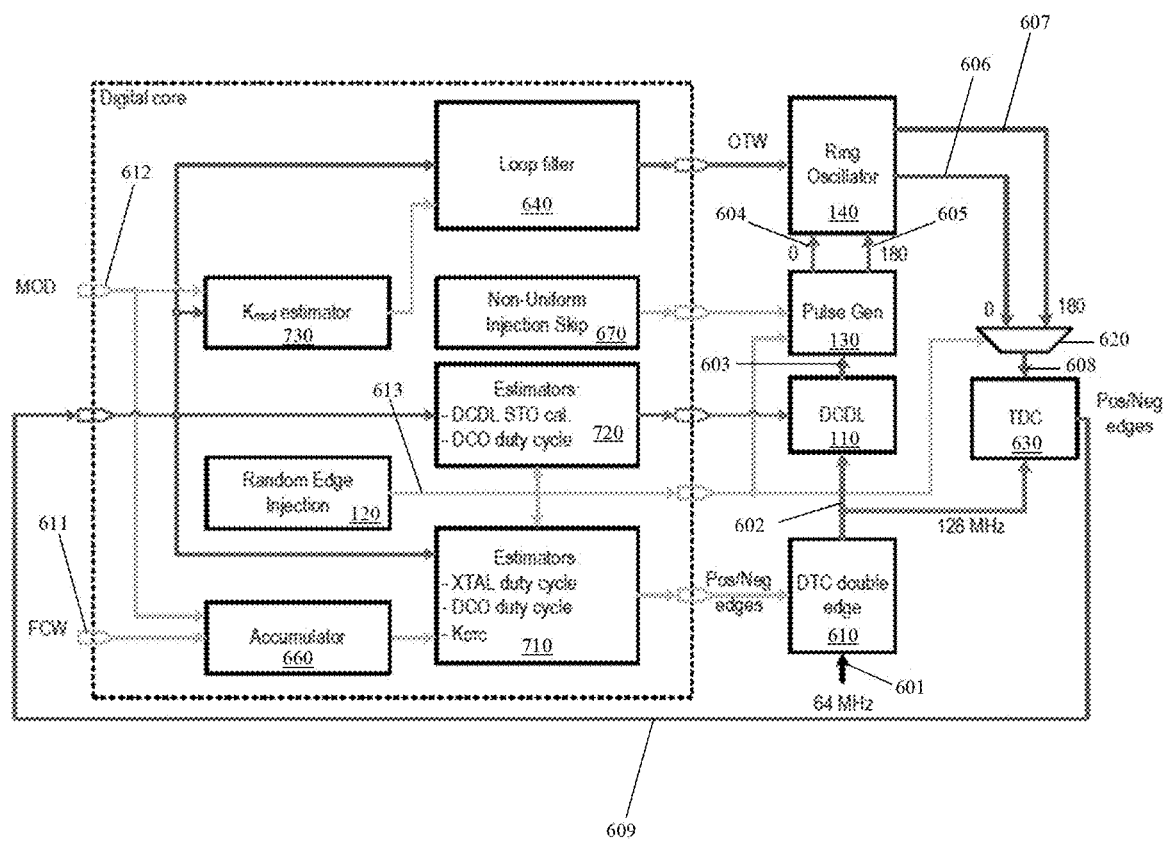
FIG. 7 shows the digital phase locked loop of FIG. 6 in detail, according to an example.

FIG. 7 illustrates the DPLL 600 of FIG. 6 in detail. The reference clock signal 601 is generated from a crystal oscillator (not shown) at a clock frequency of 64 MHz and the DTC 610 generates the delayed reference clock signal 602 at a clock frequency of 128 MHz (i.e., double edge). The DCDL 110 takes in the delayed reference clock signal 602 and further delays the signal 602. The DCDL output 603 is fed to the pulse generator 130 along with the phase select signal 613 coming from the edge selector 120. The pulse generator 130 generates a set of injection pulses 604 for phase 0 of the oscillator 140 and a set of injection pulses 605 for phase 180 of the oscillator 140 from the DCDL output 110 and the phase select signal 613.

The oscillator 140, therefore, generates RF signals, which are already reset by the injection pulses, particularly the RF signal at phase 0 of the oscillator 606 and the RF signal at phase 180 of the oscillator 607. The multiplexer 620 outputs the respective pulses 606,607 to the TDC 630 with respect to the phase select signal 613. The TDC 630 generates phase error signals by comparing the edges of the DTC output 602 with the respective RF signals 606,607 and feeds to the loop filter 640 via the feedback path 609.

The loop filter 640 generates oscillator tuning words that correspond to the phase error to tune the oscillator phases. The phase error signals are further fed to the estimators 710,720,730. Particularly, the estimator 710 estimates and/or calibrates the duty cycles of the crystal oscillator and the oscillator 140 and further tunes the DTC edges. The estimator 720 estimates and/or calibrates the static timing offset of the DCDL and the duty cycle of the oscillator 140 to tune the DCDL 110. Moreover, the estimator 730 estimates or calibrates the DPLL 600 for the modulation of the transmitting data, especially when the DPLL 600 operates in the transmitter mode.

Figure 8A:
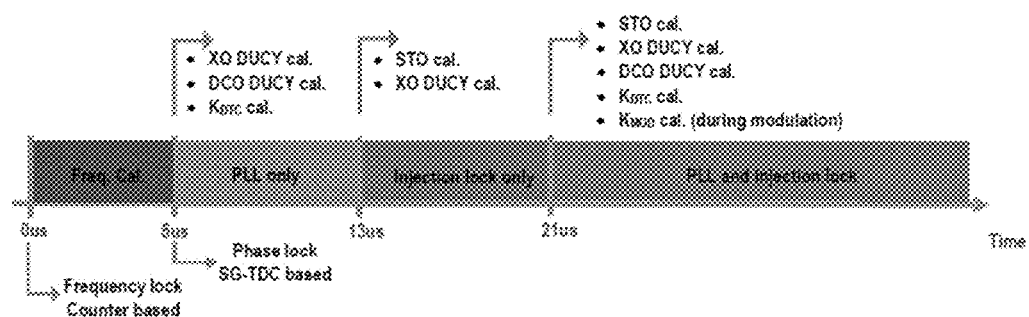
FIG. 8A shows operation phases of the digital phase locked loop, according to an example of the second aspect.
Figure 8B:
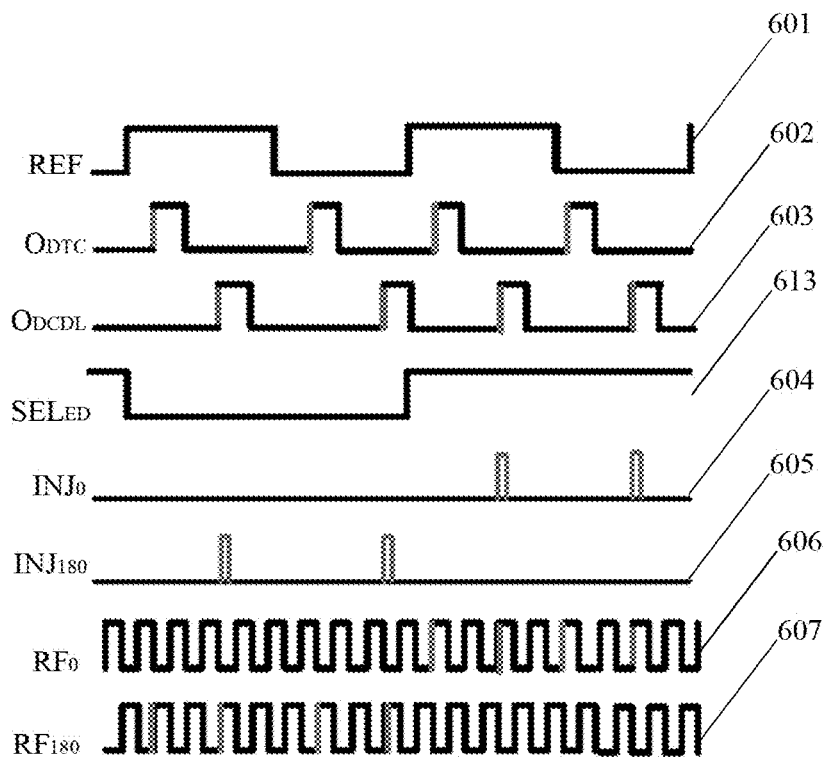
FIG. 8B shows a timing diagram of operations of the digital phase locked loop, according to an example of the second aspect.

FIG. 8A and FIG. 8B illustrate the operation phases of the DPLL 600. In particular, FIG. 8A shows the operation phases of the DPLL 600 over the required lock time. During the initial phase, the DPLL 600 uses the accumulator 660, especially the counter, to count the edges of the oscillator 140 in one reference clock to coarsely tune the oscillator 140 close to the target frequency. Then, the counter is disabled to reduce power consumption and the fine tuning of the oscillator 140 starts correcting the phase error between the RF edge 608 and the delayed reference edge 602, where the phase error is measured by the TDC 630.

During the PLL only phase, the TDC output, i.e., the phase error, is used to compute or estimate the duty cycle error of the reference clock and the RF signal and further to estimate the gain of the DTC 610. Next, the injection path is enabled, and the phase-locking path is frozen to avoid race conditions between the two loops. During the injection lock only phase, the TDC output, i.e., the phase error, is used for calibrating the duty cycle of the crystal oscillator and further to tune the delay of the DCDL 110 to reduce the static timing offset. Then, the phase-locking path and the injection path are enabled while the aforementioned calibrations are running in the background to decrease the level of spurious tones.

FIG. 8B shows the timing diagram for the operations of the DPLL 600. The signal REF represents the reference clock signal 601. The signal $O_{DTC}$ represents the DTC output, i.e., the delayed reference clock signal 602. The signal $O_{DCDL}$ represents the DCDL output, i.e., the further delayed reference clock signal 603. The signal $SEL_{ED}$ represents the phase select signal 613 generated from the edge selector 120. The signal $INJ_0$ represents the injection pulses 604 to be injected at phase 0 of the oscillator 140 and the signal $INJ_{180}$ represents the injection pulses 605 to be injected at phase 180 of the oscillator 140. The signal $RF_0$ represents the RF signal 606 from the oscillator 140 at phase 0 and the signal $RF_{180}$ represents the RF signal 607 from the oscillator 140 at phase 180.

It can be seen that, by virtue of the proposed random edge injection technique, the DPLL 600 aligns $O_{DTC}$ with rising edges of the $RF_{180}$ when the $SEL_{ED}$ is high and with rising edges of the $RF_0$ when the $SEL_{ED}$ is low. The proposed random edge injection technique further ensures the polarity of the injection signals such that the injection pulses $INJ_0$ are generated when $SEL_{ED}$ is high and the injection pulses $INJ_{180}$ are generated when $SEL_{ED}$ is low. As such, the random pattern of the DTC output 602 is effectively compensated, thereby eliminating any erroneous alignment between the phases of the $O_{DTC}$ and the RF signals.

Figure 9A:
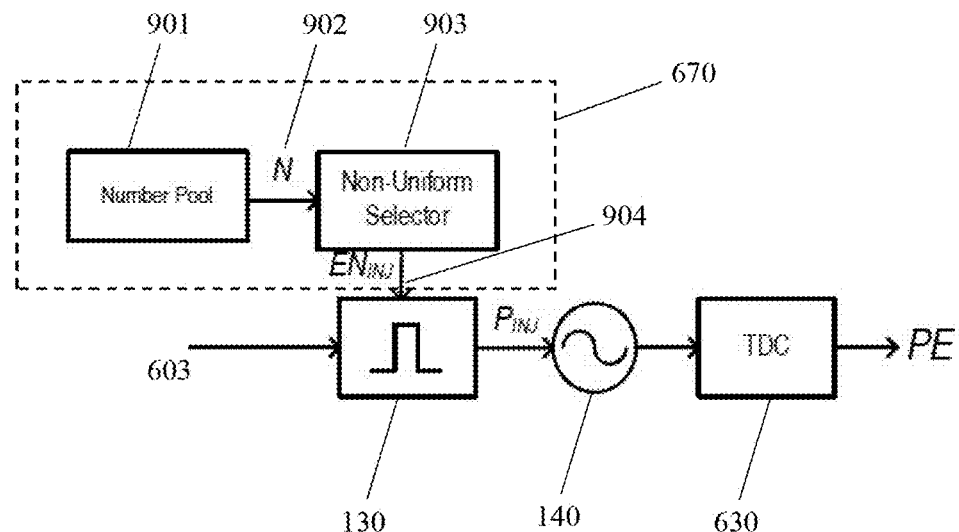
FIG. 9A shows an injection control circuit according to an example of the second aspect.
Figure 9B:
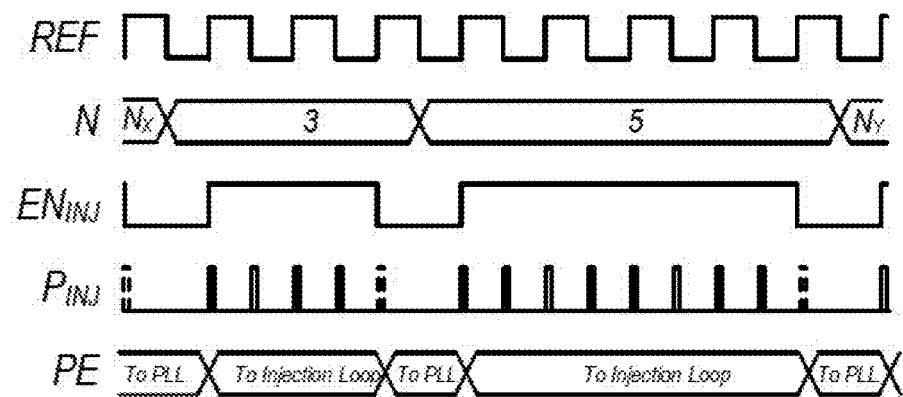
FIG. 9B shows a timing diagram of operations of the injection control circuit of FIG. 9A.

FIG. 9A and FIG. 9B illustrate the operation of the injection control circuitry 670. Particularly, FIG. 9A shows an example embodiment of the injection control circuitry 670 in a simplified block diagram, where the components of the DPLL 600 are simplified into three basic blocks in order to not repeat the DPLL 600 operation as described above with respect to FIG. 6 and FIG. 7. Generally, the injection control circuitry 670 comprises a number pool 901 that is configured to select a number N 902 from a pool of numbers with a geometric distribution for selection. It is conceivable that the pool of numbers may comprise any random distribution. It is further conceivable that the number pool 901 may select the number N 902 from the pool of numbers in a random manner.

The injection control circuitry 670 further comprises a non-uniform selector 903 that is configured to generate an enable signal 904 with a pulse duration that corresponds to the number of clock periods based on the selected number N 902. The pulse generator 130 is then configured such that the pulse generator 130 will be enabled when the enable signal 904 is high and the pulse generator 130 will be disabled when the enable signal 904 is low.

FIG. 9B shows the timing diagram for the operations performed by the injection control circuitry 670. The signal REF represents the reference clock signal. The signal N represents the number selected from the number pool 901. The signal $EN_{INJ}$ represents the enable signal. The signal PIN1 represents the injection pulses in general. The signal PE represents the phase error from the TDC 630.

It can be seen that, for example, if the output of the number pool 901 is updated to 3, the pulse generator 130 is enabled for 3 cycles of the reference clock REF. The TDC 630 compares the phase difference between the reference and the RF signal, and the output is used for tuning as described above. After 3 reference cycles, the $EN_{INJ}$ goes low. Therefore no injection pulse is sent to the oscillator 140. At this moment, the TDC output represents the phase (frequency) error of the oscillator 140 and the oscillator frequency is tuned, which further reduces the reference spur level. After that, a new number N is selected, e.g., 5 as shown, to prevent quasi static states from occurring.

Figure 10A:
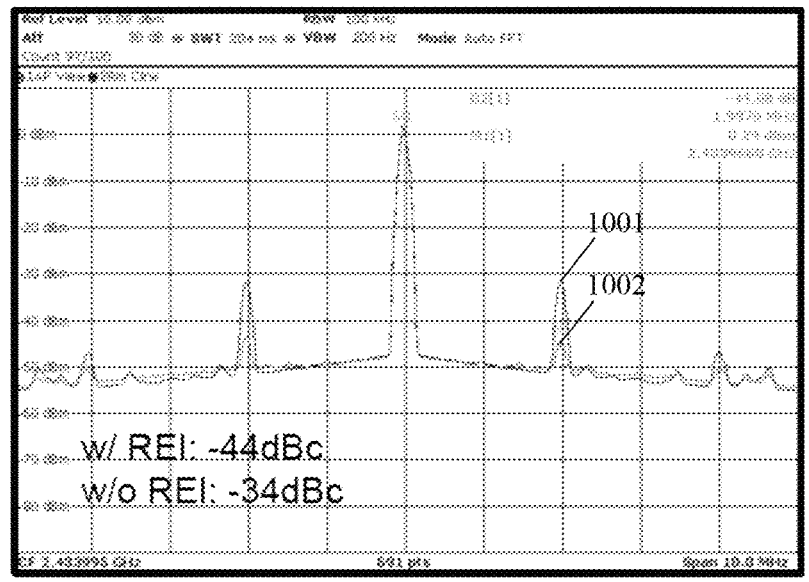
FIG. 10A shows measurement results for fractional spur level at the output spectrum, according to an example.
Figure 10B:
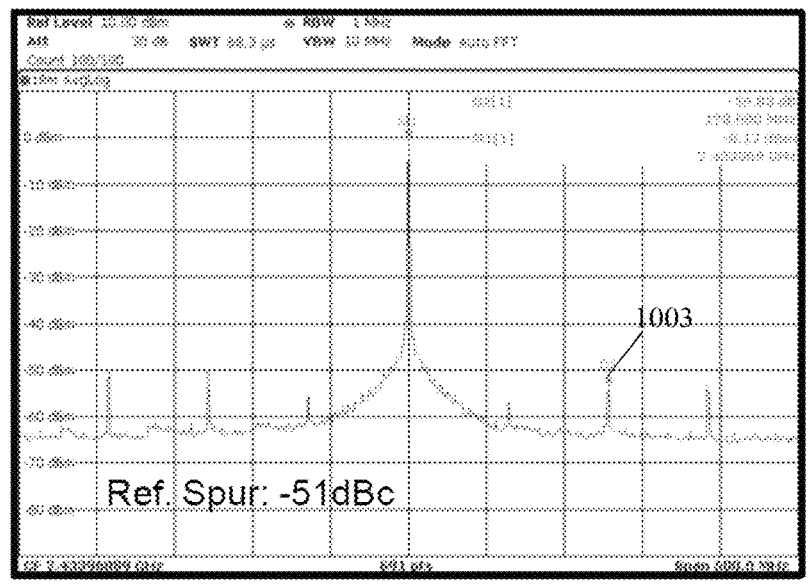
FIG. 10B shows measurement results for reference spur level at the output spectrum, according to an example.

FIG. 10A and FIG. 10B illustrate measurement results for the output spectrum indicating the spur level reduction by means of the proposed random edge injection technique. In particular, FIG. 10A shows the fractional spur level for two output spectrums, where the first spectrum 1001 represents the DPLL output without the proposed random edge injection technique and the second spectrum 1002 represents the DPLL output with the proposed random edge injection technique. FIG. 10B shows the reference spur level at the DPLL output 1003 where the proposed random edge injection technique is implemented.

FIG. 10A shows the fractional spur at 2.434 GHz where the fractional part is 2 MHz. It can be seen that the fractional spur is −34 dBc at the DPLL output 1001 if the random edge injection technique is not implemented. Whereas the fractional spur is −44 dBc at the DPLL output 1002 where the proposed random edge injection technique is implemented. From FIG. 10B, it can be seen that the reference spur at the DPLL output is −51 dBc.

Figure 11:
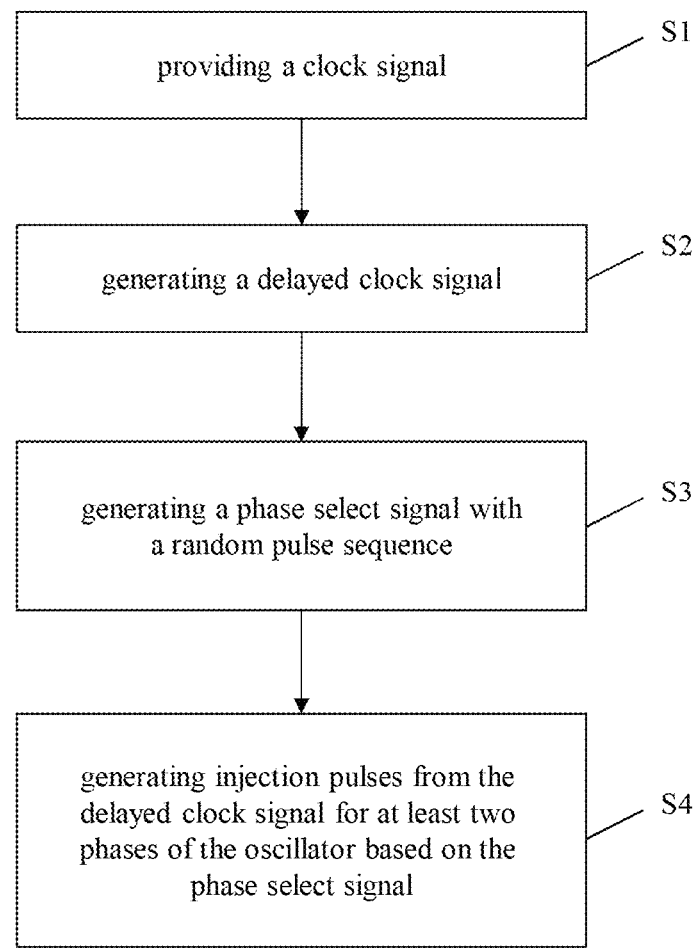
FIG. 11 shows a method, according to an example of the third aspect.

FIG. 11 illustrates an example embodiment of the method according to the third aspect. In a first step S1, a clock signal is provided. In a second step S2, a delayed clock signal is generated from the clock signal. In a third step S3, a phase select signal is generated with a random pulse sequence. In a fourth step S4, injection pulses are generated from the delayed clock signal for at least two phases of the oscillator based on the phase select signal.

Particularly, a first set of injection pulses are generated for one phase of the at least two phases of the oscillator when the phase select signal is high and a second set of injection pulses are generated for another phase of the at least two phases of the oscillator when the phase select signal is low.

The embodiments can be implemented by hardware, software, or any combination thereof. Various embodiments may be implemented by one or more application-specific integrated circuits (ASICs), digital signal processors (DSPs), digital signal processing devices (DSPDs), programmable logic devices (PLDs), field-programmable gate arrays (FPGAs), processors, controllers, microcontrollers, microprocessors, or the like.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A circuit for facilitating random edge injection locking of an oscillator comprising:
    a clock signal;
    a digitally controlled delay line configured to delay the clock signal, thereby generating a delayed clock signal;
    an edge selector configured to generate a phase select signal with a random pulse sequence; and
    a pulse generator downstream from the digitally controlled delay line configured to generate injection pulses from the delayed clock signal for at least two phases of the oscillator based on the phase select signal.

2. The circuit according to claim 1, wherein the pulse generator is further configured to generate a first set of injection pulses for one phase of the at least two phases of the oscillator when the phase select signal is high, and a second set of injection pulses for another phase of the at least two phases of the oscillator when the phase select signal is low.

3. The circuit according to claim 2, wherein the circuit further comprises:
    control circuitry configured to tune a delay of the digitally controlled delay line based on a duty cycle of the clock signal to compensate at least one half of an oscillator period when injecting the injection pulses from one phase to another phase of the at least two phases of the oscillator.

4. The circuit according to claim 3, wherein the edge selector comprises:
    a pseudo-random binary sequence generator and the phase select signal comprises a pseudo-random binary sequence.

5. The circuit according to claim 4, wherein the oscillator is a quadrature four-stage ring oscillator operable with a minimum phase separation equal to pi/2.

6. The circuit according to claim 5, wherein the oscillator is a multi-phase oscillator and wherein the pulse generator is configured to generate injection pulses for phases of the multi-phase oscillator based on the phase select signal.

7. The circuit according to claim 1, wherein the circuit further comprises:
    control circuitry configured to tune a delay of the digitally controlled delay line based on a duty cycle of the clock signal to compensate at least one half of an oscillator period when injecting the injection pulses from one phase to another phase of the at least two phases of the oscillator.

8. The circuit according to claim 1, wherein the edge selector comprises:
    a pseudo-random binary sequence generator and the phase select signal comprises a pseudo-random binary sequence.

9. The circuit according to claim 1, wherein the oscillator is a quadrature four-stage ring oscillator operable with a minimum phase separation equal to pi/2.

10. The circuit according to claim 1, wherein the oscillator is a multi-phase oscillator and wherein the pulse generator is configured to generate injection pulses for phases of the multi-phase oscillator based on the phase select signal.

11. The circuit according to claim 10, wherein the circuit further comprises:
    switching circuitry downstream from the pulse generator to inject the injection pulses at the phases of the multi-phase oscillator, and wherein the switching circuitry is configured to be operable via a random switching logic.

12. A method, performed by a circuit, for facilitating random edge injection locking of an oscillator comprises the steps of:
    providing a clock signal;
    generating, by a digitally controlled delay line configured to delay the clock signal, a delayed clock signal;
    generating, by an edge selector, a phase select signal with a random pulse sequence; and
    generating, by a pulse generator downstream from the digitally controlled delay line, injection pulses from the delayed clock signal for at least two phases of the oscillator based on the phase select signal.

13. The method according to claim 12, wherein the method further comprises:
    generating, by the pulse generator, a first set of injection pulses for one phase of the at least two phases of the oscillator when the phase select signal is high; and
    generating, by the pulse generator, a second set of injection pulses for another phase of the at least two phases of the oscillator when the phase select signal is low.

14. The method according to claim 12, wherein the method further comprises:
    compensating, by control circuitry configured to tune a delay of the digitally controlled delay line based on a duty cycle of the clock signal, at least one half of an oscillator period when injecting the injection pulses from one phase to another phase of the at least two phases of the oscillator.

* * * * *